United States Patent
Tews et al.

(10) Patent No.: US 6,740,555 B1
(45) Date of Patent: May 25, 2004

(54) SEMICONDUCTOR STRUCTURES AND MANUFACTURING METHODS

(75) Inventors: Helmut Horst Tews, Poughkeepsie, NY (US); Alexander Michaelis, Leverkusen (DE); Stephan Kudelka, Fishkill, NY (US); Uwe Schroeder, Fishkill, NY (US); Raj Jammy, Wappingers Falls, NY (US); Ulrike Gruening, Wappingers Falls, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,248

(22) Filed: Sep. 29, 1999

(51) Int. Cl.⁷ .................. H01L 21/8242; H01L 21/336; H01L 21/108
(52) U.S. Cl. .................. 438/242; 438/243; 438/301; 438/305; 438/386; 257/68; 257/905
(58) Field of Search .................. 257/68, 301, 305, 257/905; 438/243, 242, 386

(56) References Cited

U.S. PATENT DOCUMENTS

| | | | |
|---|---|---|---|
| 3,796,612 A | | 3/1974 | Allison |
| 3,883,948 A | * | 5/1975 | Allison .................. 29/577 |
| 3,986,200 A | * | 10/1976 | Allison .................. 357/55 |
| 4,017,885 A | * | 4/1977 | Kendall et al. .................. 357/14 |
| 4,047,195 A | * | 9/1977 | Allison .................. 357/48 |
| 4,278,987 A | * | 7/1981 | Imaizumi et al. .................. 357/48 |
| 4,397,075 A | * | 8/1983 | Fatula et al. .................. 29/571 |
| 4,467,343 A | * | 8/1984 | Herberg .................. 357/38 |
| 4,833,516 A | * | 5/1989 | Hwang et al. .................. 357/23.6 |
| 4,916,511 A | * | 4/1990 | Douglas .................. 357/23.6 |

(List continued on next page.)

FOREIGN PATENT DOCUMENTS

EP 0 302 204 2/1989

OTHER PUBLICATIONS

Patent Abstracts of Japan Publication No. 63–177546, date of publication of application: Jul. 21, 1988, 1 page. (English Abstract Only).

*Primary Examiner*—Long Pham
*Assistant Examiner*—Shrinivas H Rao
(74) *Attorney, Agent, or Firm*—Slater & Matsil, L.L.P.

(57) ABSTRACT

A method for forming substantially uniformly thick, thermally grown, silicon dioxide material on a silicon body independent of axis. A trench is formed in a surface of the silicon body, such trench having sidewalls disposed in different crystallographic planes, one of such planes being the <100> crystallographic plane and another one of such planes being the <110> plane. A substantially uniform layer of silicon nitride is formed on the sidewalls. The trench, with the substantially uniform layer of silicon nitride, is subjected to a silicon oxidation environment with sidewalls in the <110> plane being oxidized at a higher rate than sidewalls in the <100> plane producing silicon dioxide on the silicon nitride layer having thickness over the <110> plane greater than over the <100> plane. The silicon dioxide is subjected to an etch to selectively remove silicon dioxide while leaving substantially un-etched silicon nitride to thereby remove portions of the silicon dioxide over the <100> plane and to thereby expose underlying portions of the silicon nitride material while leaving portions of the silicon dioxide over the <110> plane on underlying portions of the silicon nitride material. Exposed portions of the silicon nitride material are selectively removed to expose underlying portions of the sidewalls of the trench disposed in the <100> plane while leaving substantially un-etched portions of the silicon nitride material disposed on sidewalls of the trench disposed in the <110> plane. The structure is then subjected to an silicon oxidation environment to produce the substantially uniform silicon dioxide layer on the sidewalls of the trench.

7 Claims, 6 Drawing Sheets

U.S. PATENT DOCUMENTS

| | | | | |
|---|---|---|---|---|
| 4,918,503 A | * | 4/1990 | Okuyama | 357/23.6 |
| 5,307,433 A | * | 4/1994 | Stein | 385/88 |
| 5,406,515 A | * | 4/1995 | Rajeevakumar | 365/182 |
| 5,484,507 A | | 1/1996 | Ames | |
| 5,576,223 A | | 11/1996 | Zeininger et al. | |
| 5,641,694 A | | 6/1997 | Kenney | |
| 5,744,826 A | * | 4/1998 | Takeuchi et al. | 257/77 |
| RE35,810 E | * | 5/1998 | Prall | |
| 5,905,283 A | | 5/1999 | Kasai | |
| 6,093,618 A | * | 7/2000 | Chen et al. | 438/400 |
| 6,140,673 A | * | 10/2000 | Kohyama | 257/301 |
| 6,348,388 B1 | * | 2/2002 | Faltermeier et al. | 438/303 |

\* cited by examiner

SEMICONDUCTOR STRUCTURES AND MANUFACTURING METHODS

BACKGROUND OF THE INVENTION

This invention relates generally to semiconductor structures and manufacturing methods and more particularly to the growth of silicon dioxide material on silicon semiconductor bodies with thicknesses substantially independent of the crystallographic orientation of the wall upon which such material is grown.

As is known in the art, many applications require the formation of silicon dioxide material on the walls of a silicon semiconductor body. One such application is in the formation of a gate oxide in a field effect transistor (FET). There, the silicon dioxide is generally thermally grown on the silicon body to provide a gate oxide for the FET. After such formation, a gate stack, i.e., electrode, is formed on the grown silicon dioxide. Next, ions are implanted through the grown silicon dioxide gate material. After activation of the ions by an anneal process, the source and drain regions for the FET are provided.

SUMMARY OF THE INVENTION

In accordance with one feature of the invention, a method is provided for forming substantially uniformly thick, thermally grown, silicon dioxide material on sidewall portions of a trench in a surface of a single crystal semiconductor body independent of crystallographic axis.

In accordance with one embodiment of the invention, a method is provided for forming a thermally grown oxide on a surface having surface portions thereof disposed in different crystallographic planes. The method includes providing a relatively thin material on selected ones of the surface portions, such selected ones of the surface portions having crystallographic planes which, when subjected to a thermal oxidation process, grow such oxide at a relatively higher rate then the rate such oxidation process grows such oxide on un-selected surface portions disposed in other crystallographic planes. The surface portions are subjected to the oxidation process to grow the oxide with a thickness greater than the thickness of the material, such oxide being grown over the selected surface portions and the un-selected surface portions with a substantially uniform thickness.

In one embodiment of the invention, a trench in a surface of a single crystal silicon body, such trench having sidewalls disposed in different crystallographic planes, one of such planes being the <100> crystallographic plane and another one of such planes being the <110> plane. A substantially uniform layer of silicon nitride is formed on the sidewalls of the trench. The trench, with the substantially uniform layer of silicon nitride on the sidewalls thereof, is subjected to a silicon oxidation environment with sidewalls in the <110> plane being oxidized at a higher rate than sidewalls in the <100> plane producing silicon dioxide on the silicon nitride layer having thickness over the <110> plane greater than over the <100> plane. The silicon dioxide is subjected to an etch which selectively removes silicon dioxide while leaving substantially un-etched silicon nitride, such subjecting being for a time selected to remove portions of the silicon dioxide over the <100> plane to thereby expose underlying portions of the silicon nitride material while leaving portions of the silicon dioxide over the <110> plane on underlying portions of the silicon nitride material. Exposed portions of the silicon nitride material are selectively removed to expose underlying portions of the sidewalls of the trench disposed in the <100> plane while leaving substantially un-etched portions of the silicon nitride material disposed on sidewalls of the trench disposed in the <110> plane. The exposed underlying portions of the sidewalls of the trench disposed in the <100> plane and the un-etched portions of the silicon nitride material disposed on sidewalls of the trench disposed in the <110> plane are subjected to an silicon oxidation environment with the exposed sidewalls in the <100> plane being oxidized at substantially the same rate as the sidewalls in the <110> plane having the un-etched silicon nitride material thereon to produce a substantially uniform silicon dioxide layer on the sidewalls of the trench.

In accordance with another feature of the invention, a single crystal semiconductor body is provided having a trench with sidewall portions disposed in different crystallographic planes of the body, such sidewall portions having thereon substantially uniformly thick, thermally grown, silicon dioxide material.

BRIEF DESCRIPTION OF THE DRAWING

These and other features of the invention, as well as the invention itself, will become more readily apparent from the following detailed description when read together with the accompanying drawings, in which.

DESCRIPTION OF THE PREFERRED EMBODIMENTS

Figure 1A:
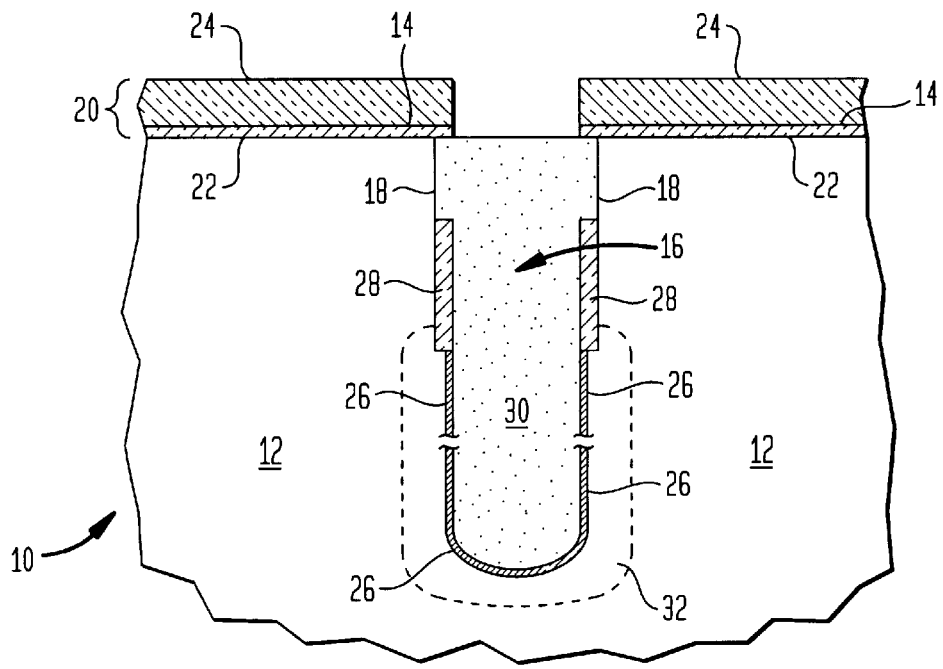
FIGS. 1A through 1E are cross-section elevation views of a semiconductor structure at various stages in the fabrication thereof according to the invention.
Figure 2A:
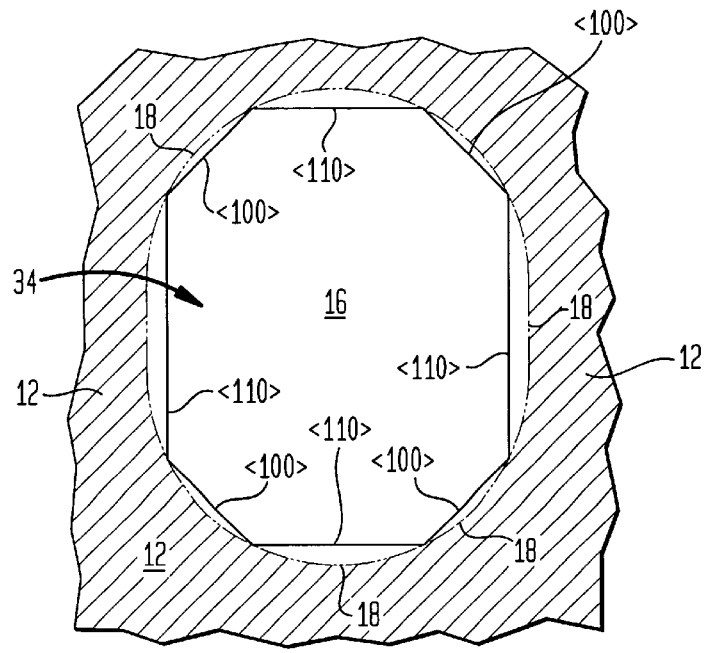
FIGS. 2A through 2E are cross-section plan views of the semiconductor structure of FIGS. 1A through 1D, the cross-section of FIG. 2B being taken along line 2A—2A in FIG. 1C.

Referring now to FIG. 1A, a semiconductor structure 10, is shown. The structure 10 includes a single crystal silicon substrate 12 having in a upper surface 14 thereof a trench 16. Here, the substrate 12 is P type doped silicon. The upper surface 14 is here disposed in the <100> crystallographic plane of the silicon substrate 12. The trench 16 is a generally oval shape in the plane of the upper surface 14, as will be described in more detail in connection with FIG. 2A. Suffice it to say here, however, that because of the oval shape, shown dotted in FIG. 2A, it follows therefore that sidewalls 18 of the trench 16 are disposed in a number of different crystallographic planes, the most significant planes under consideration here are the <100> and <110> planes as shown in FIG. 2A by the hexagonal approximation to the oval shaped periphery of the trench 12.

Referring again to FIG. 1A, a dielectric layer 20, here a thin lower layer 22 of silicon dioxide and a thicker, upper layer 24 silicon nitride is also provide in a conventional manner. The bottom portion of the trench 16 is formed to provide a trench capacitor for a Dynamic Random Access Memory (DRAM) cell. Thus, the bottom portion of the trench 16 is covered with a node dielectric 26 and a dielectric collar 28, arranged in a conventional manner as shown. Disposed in the trench 16 is an electrical conductor 30 (i.e., one electrode of the capacitor), here doped polycrystalline silicon. A buried electrode 32 is formed in the substrate 12 in any conventional manner to provide the second electrode of the capacitor.

Figure 1B:
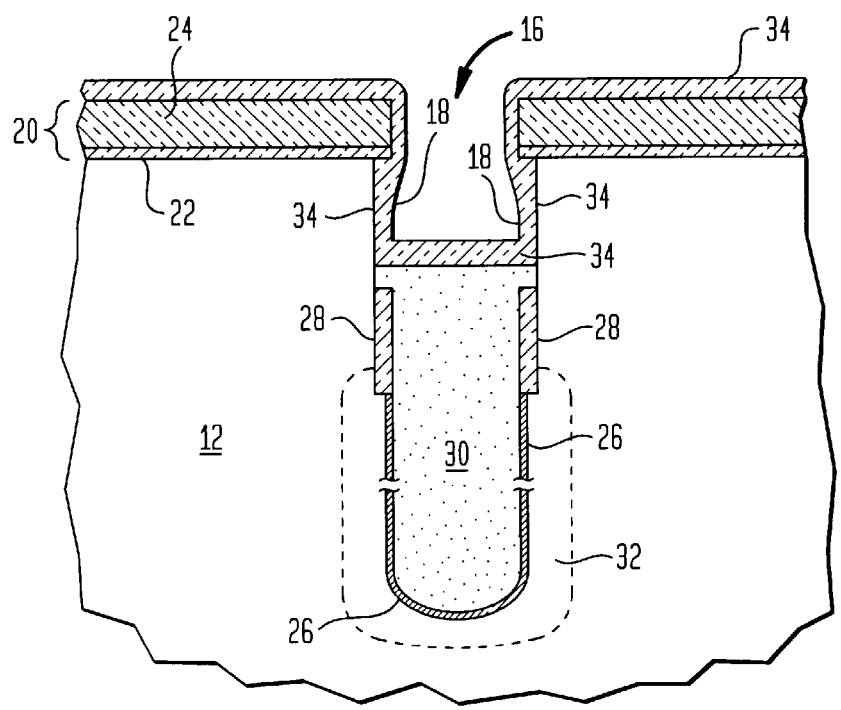

Referring now to FIG. 1B, the upper portions of the polycrystalline silicon conductor 30 are removed in any convention recessing process. Next, a trench top oxide (TTO) layer 34 is formed over the top portion of the trench 16, as indicated. The TTO 34 is a deposited oxide. The deposition of the TTO 34 results in a thinner deposition on the sidewalls 18 of the trench 16 than on the polycrystalline silicon 30. Typically, the thickness of the TTO 34 on the sidewalls 18 is about 300 Angstroms and on the polycrystalline silicon 30 about 1000 Angstroms.

Figure 1C:
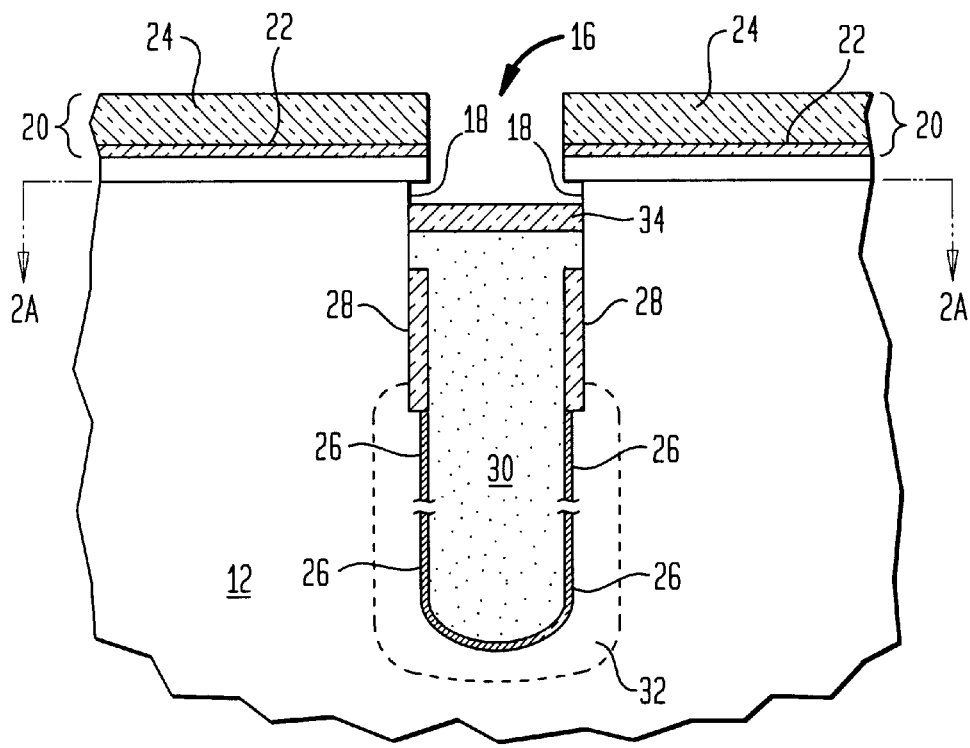

Next, a timed, wet etch is used to remove, in this example, about 300 Angstroms of the TTO 34, thereby removing the TTO 34 from the sidewalls 18 of the trench 16 while leaving about 700 Angstroms of TTO on the polycrystalline silicon 30, as indicated in FIG. 1C.

Referring now to FIG. 2A, the cross-section of the upper portion of the trench 16 in FIG. 1C is shown. It is noted that after removal of the TTO 34 on the sidewalls of the trench 16, the silicon sidewalls 18 of the upper portion of trench 16 are exposed.

Figure 2B:
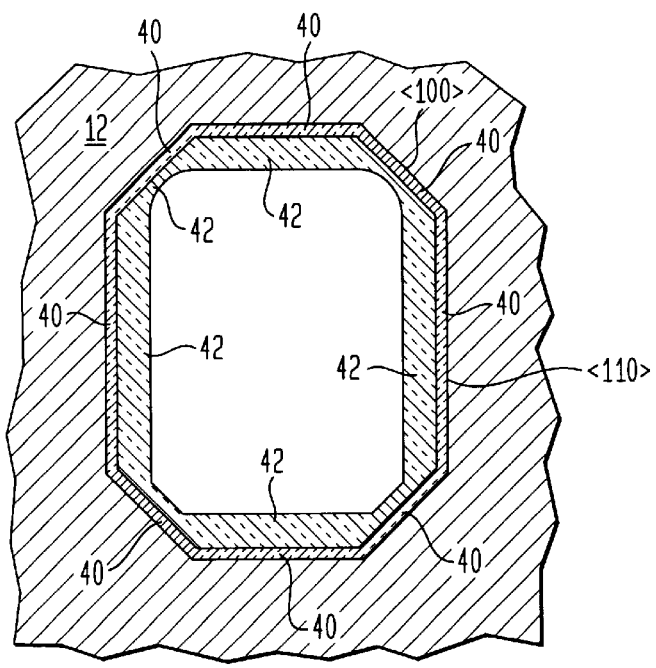

Next, the structure shown in FIGS. 1C and 2B are exposed to a thermal nitridation process to create a thin, substantially uniform, silicon nitride layer 40 (FIG. 2B) over the sidewalls 18 of the upper portion of the trench 16, i.e., on the silicon sidewalls 18 of the trench 16. It is noted that the nitridation is self limiting. Therefore, the thickness of the silicon nitride 40 is independent of the crystallographic plane upon which it is grown. It is noted that different nitridation techniques may be used. For example, here the thermal nitridation is in an ammonia ($NH_3$) atmosphere at low pressure, e.g., 10 Torr. The thickness of the silicon nitride layer 40 is here, for example, 5 Angstroms to 20 Angstroms. Alternatively, the thermal nitridation process may be performed as follows: A conformal plasma ion implantation of $N_2$ can be made into the trench sidewalls. The implantation dose is selected between $1 \times 10^{14}$ per $cm^2$ and $1 \times 10^5$ per $cm^2$. After the implantation, the oxide is thermally grown. During the oxidation process, the nitrogen diffuses to the silicon-silicon dioxide interface and thereby forms a very thin nitride layer.

Next, the structure shown in FIG. 2B, is placed in an oxidation environment to thermally grow a first silicon dioxide layer 42. It is noted that the thickness of the silicon dioxide layer 42 is dependent on the crystallographic plane in which the sidewall 18 of the silicon trench 16 is disposed. Here, however, the oxidation rate of the silicon is reduced on sidewalls 18 of the silicon substrate 12 having the silicon nitride layer 40. When the oxidation temperature is, for example, 750 to 1000 degrees Centigrade, the thickness of the silicon dioxide layer 42 on the sidewalls 18 of the silicon trench in the <100> plane is half the thickness on the sidewalls of the silicon trench in the <110> plane. Further, if under such oxidation conditions, the silicon trench 16 sidewalls 18 were not covered with silicon nitride layer 40, growth of silicon dioxide layer to a thickness of 100 Angstroms on the sidewalls 18 in the <110> plane would yield a thickness of silicon dioxide layer of 50 Angstroms on the sidewalls in the <100> plane; however, if under the same oxidation conditions, the thin layer of silicon nitride were on the silicon sidewalls 18 of the trench, the thickness of the silicon dioxide over the sidewalls 18 in the <110> plane would be 50 Angstroms while the thickness of silicon dioxide over the sidewalls 18 in the <100> plane would be 25 Angstroms.

As an example, a low temperature thermal nitridation at 500 to 700 degrees Centigrade in $NH_3$ is performed. The first silicon dioxide layer 42 is thermally grown in an oxidizing environment at 800 to 900 degrees Centigrade to a thickness of 50 Angstroms on the <100> plane. The presence of the silicon nitride layer 40 leads, in this case, to a reduction of the oxidation rate of a factor of 2, as noted above. Therefore, if one measures the thickness of the first silicon dioxide layer 42, such layer 42 will have a thickness of 25 Angstroms over the sidewalls 18 of the trench in the <100> plane and a thickness of 50 Angstroms over the sidewalls 18 of the trench in the <110>.

Next, the structure shown in FIG. 2B is subjected to a wet etch which is selective to silicon dioxide; that is, an etch, here dilute hydrofluoric acid, which etches the first silicon dioxide layer 42 while leaving substantially un-etched silicon nitride layer 40. Thus, the wet etch is chosen such that only the thin, here 25 Angstroms thick, first silicon dioxide layer 42 is removed while 25 Angstroms of the first silicon dioxide layer 42 remain on the portions of the silicon nitride layer 40 disposed over the silicon trench sidewalls 18 disposed in the <110> planes.

Figure 2C:
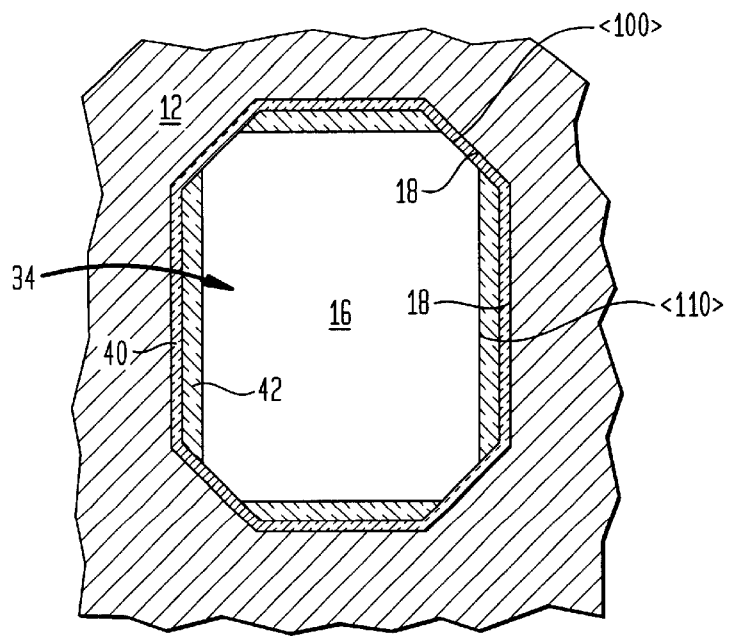
Figure 2D:
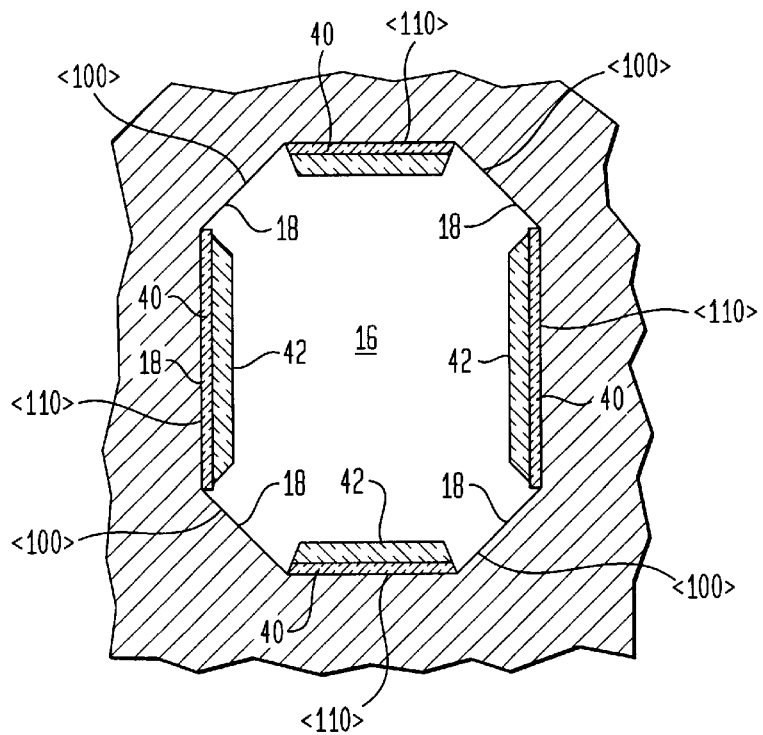

Next, and referring also to FIG. 2D, the structure in FIG. 2C is brought into contact with any conventional wet etch selective to silicon nitride. Thus, only the exposed portions of the silicon nitride layer 40, i.e., the portions of the silicon nitride layer 40 disposed over the silicon trench sidewalls 18 disposed in the <110> planes, are removed thereby exposing underlying portions of the sidewalls of the silicon trench 16 disposed in the <110> planes. It is noted that, as a next step, the thin first silicon dioxide layer 42 over the silicon sidewall 18 portions of the trench 16 in the <100> plane, may be, optionally, removed.

Figure 1D:
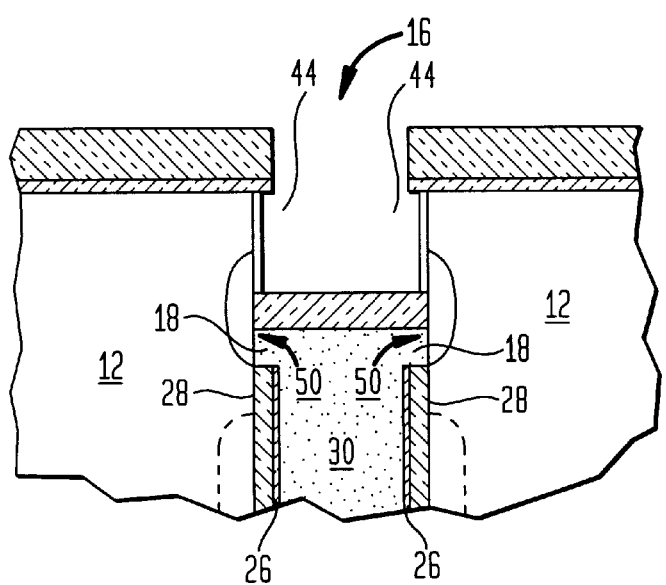
Figure 2E:
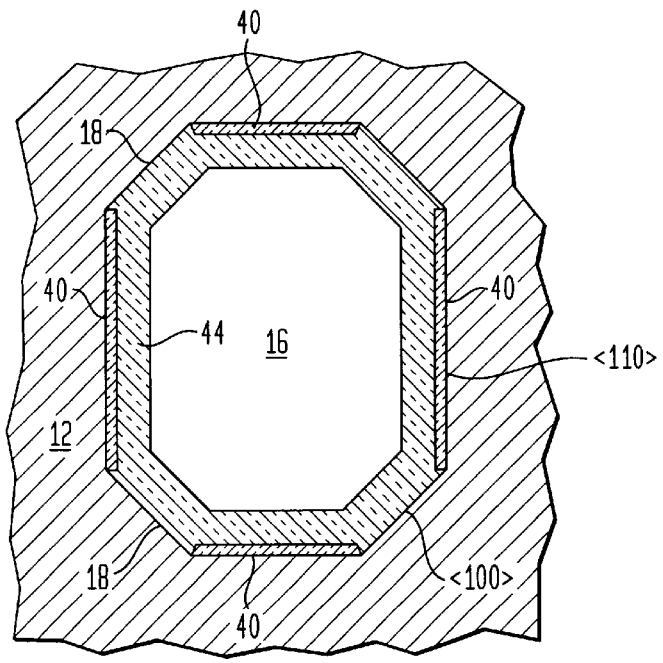

Next, the structure shown in FIG. 2D is subjected to a second thermal oxidation process to form, at a relatively high oxidation rate on silicon sidewalls 18 in the <100> plane and at a lower (i.e., one-half) oxidation rate, on the silicon sidewalls in the <110> planes because of the presence of the silicon nitride on such sidewalls 18. The resulting structure is shown in FIG. 2E By choosing the proper nitridation, first and second oxidation thicknesses and oxidation process temperature, an optimum process can be designed for a target uniform silicon dioxide thickness ratio between the <100> and <110> plane thereby resulting in a substantially uniform gate oxide layer 44 on the sidewall 18 if the silicon trench 16 independent of the crystallographic plane upon which the silicon dioxide layer 44 is grown. The resulting structure is shown in FIGS. 1D and 2E; it being noted that there has been an out-diffusion of the dopant in the doped polycrystalline silicon 30 through a buried strap region 50 formed on the sidewalls 18 of the trench 16 between the bottom TTO 34 and the buried dielectric collar 28, as indicated. This diffusion region provides the source/drain region, here the drain region D, of the DRAM cell transistor and is electrically connected to-the doped polycrystalline silicon 30 through the doped buried strap region 50.

It is noted that the resulting gate dielectric (i.e., the silicon dioxide layer 44) is different for the <100> plane and the <110> plane; the former gate dielectric having the about 50 Angstroms thick second silicon dioxide layer and the latter gate dielectric having a bottom layer of about 5 Angstroms thick silicon nitride, an intermediate, optional, layer of about 25 Angstroms thick first silicon dioxide layer; and an upper layer of about 25 Angstroms thick second silicon dioxide layer.

Figure 1E:
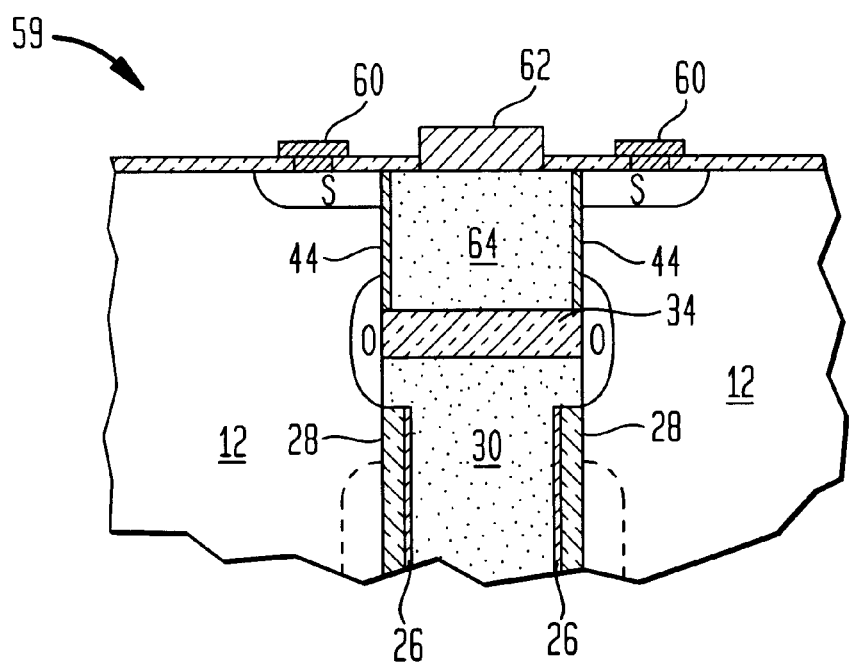

Referring to FIG. 1E, the structure shown in FIG. 1D is then processed in any conventional manner to complete the transistor portion of the DRAM cell, 59 i.e, form a drain/ source region, here source region, S, with its electrical contact 60 and the metal electrode 62 for the gate disposed on a doped polycrystalline silicon material 64 disposed in the upper portion of the trench. The contact to the drain electrode is through the buried plate using a conventional deep implantation through the surface of the substrate to a buried layer connected to the buried plate in any conventional manner.

Referring now to FIG. 3A to 3D an alternative embodiment of the invention is shown. Here, and referring to FIG. 3A, a rectangular trench 80 is formed in a silicon substrate 82 with the sidewalls 84 thereof disposed in the <110> crystallographic plane of the silicon substrate 82.

Figure 3A:
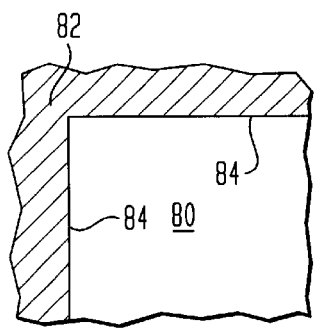
FIGS. 3A through 3D are cross-section plan views of a semiconductor structure at various stages in the fabrication thereof according to another embodiment of the invention.
Figure 3B:
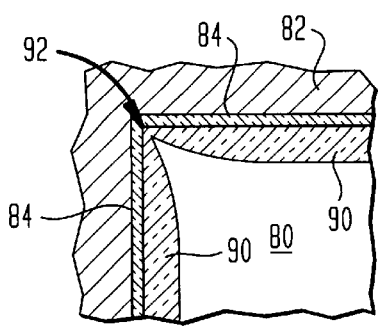

Referring to FIG. 3B, the structure shown in FIG. 3A is subjected to a thermal nitridation process such as described above in connection with FIG. 2B where a thin silicon nitride layer 88 is formed. Next, the structure is subjected to an oxidation process such as described above in connection with FIG. 2B to produce a layer 90 of silicon dioxide. It is noted that layer 90 of silicon dioxide is not uniform in thickness because of the change in crystallographic orientation at the corners 92 of the rectangular shaped trench 90. Thus, as shown in FIG. 3B, the thickness of the silicon dioxide layer 90 is tapped down in thickness as the layer 90 progress from the sides of the rectangle to the corners 92 of the rectangle, as indicated in FIG. 3B.

Figure 3C:
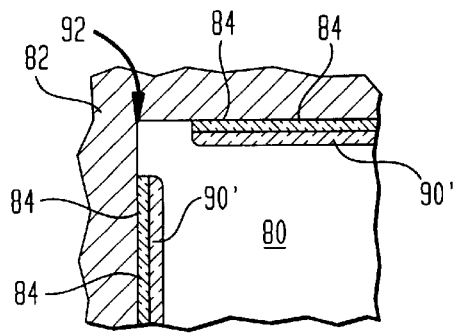

Referring now to FIG. 3C, the structure shown in FIG, 3B is subjected to an etch to reduce the thickness of the thicker silicon dioxide layer 90 (FIG. 3B) to a thinner layer 90' over the sidewalls 84 of the trench 80 while completely removing the thinner portions of the silicon dioxide layer 90 (FIG. 3B) in the corner regions 92 of the trench 80 thus exposing portions of the underlying silicon nitride layer 84 in the corner regions of the trench. The exposed portions of the silicon nitride layer are selectively removed as described in FIG. 2D to expose the portions of the silicon 82 in the corners 92 as indicated in FIG. 3C. Thus, the structure shown in FIG. 3B is processed in the same manner as described above in connection with FIG. 2D.

Figure 3D:
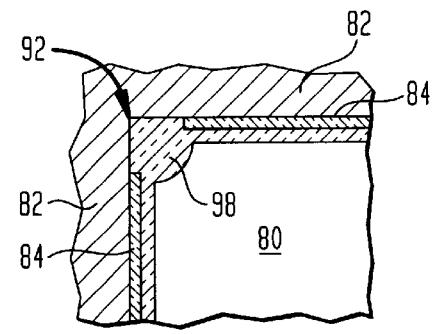

Next, the structure shown in FIG. 3C is subjected to a second thermal oxidation process as described above in connection with FIG. 3E to produce the structure shown in FIG. 3D. It is noted that the structure in FIG. 3D has increased silicon dioxide material 98 thickness in the corner regions as compare with the structure shown in FIG. 3B. Thus, stress related oxide thinning in the corners has been reduced.

Other embodiments are within the spirit and scope of the appended claims.

What is claimed is:

1. A method comprising forming substantially uniformly thick, thermally grown, silicon dioxide material on sidewall portions of a trench in a surface of a single crystal semiconductor body, such sidewall portions being disposed in different crystallographic planes of the body, the sidewall portions disposed in one of the different crystallographic planes growing the silicon dioxide material at a substantially different rate than the growth of such silicon dioxide material on the sidewall portions disposed in another one of the different crystallographic planes when the sidewall portions of the trench are subjected to a thermal oxidation process.

2. A method for forming a thermally grown oxide on a surface having surface portions thereof disposed in different crystallographic planes, comprising:

providing a relatively thin material on selected ones of the surface portions, such selected ones of the surface portions having crystallographic planes which, when subjected to a thermal oxidation process, grow such oxide at a relatively higher rate than the rate such oxidation process grows such oxide on un-selected surface portions disposed in other crystallographic planes;

subjecting the surface portions to the oxidation process to grow the oxide with a thickness greater than the thickness of the material, such oxide being grown over the selected surface portions and the un-selected surface portions with a substantially uniform thickness.

3. A method for forming a thermally grown oxide on a surface having surface portions thereof disposed in different crystallographic planes, comprising:

providing a trench in a surface of a single crystal silicon body, such trench having sidewalls disposed in different crystallographic planes, one of such planes being the <100> crystallographic plane and another one of such planes being the <110> plane;

forming a substantially uniform layer of silicon nitride on the sidewalls of the trench;

subjecting the trench with substantially uniform layer of silicon nitride on the sidewalls thereof to a silicon oxidation environment with sidewalls in the <110> plane being oxidized at a higher rate than sidewalls in the <100> plane producing silicon dioxide on the silicon nitride layer having thickness over the <110> plane greater than over the <100> plane;

subjecting the silicon dioxide to an etch which selectively removes silicon dioxide while leaving substantially un-etched silicon nitride, such subjecting being for a time selected to remove portions of the silicon dioxide over the <100> plane to thereby expose underlying portions of the silicon nitride material while leaving portions of the silicon dioxide over the <110> plane on underlying portions of the silicon nitride material;

selectively removing exposed portions of the silicon nitride material to expose underlying portions of the sidewalls of the trench disposed in the <100> plane while leaving substantially un-etched portions of the silicon nitride material disposed on sidewalls of the trench disposed in the <110> plane;

subjecting the exposed underlying portions of the sidewalls of the trench disposed in the <100> plane and the un-etched portions of the silicon nitride material disposed on sidewalls of the trench disposed in the <110> plane to an silicon oxidation environment with the exposed sidewalls in the <100> plane being oxidized at substantially the same rate as the sidewalls in the <110> plane having the un-etched silicon nitride material thereon to produce a substantially uniform silicon dioxide layer on the sidewalls of the trench.

4. The method of claim 1 wherein one of the sidewall portions is disposed in a <100> crystallographic plane and another one of the sidewall portions is disposed in a <110> crystallographic plane.

5. The method of claim 2 wherein the relatively thin material is silicon nitride.

6. The method of claim 2 wherein the relatively thin material is less than approximately 20 Angstroms.

7. The method of claim 2 wherein the relatively thin material forms a layer which is thinner than the corresponding oxide layer grown on the selected and unselected surface portions.

* * * * *